United States Patent
Nilsson

[11] Patent Number: 6,083,814
[45] Date of Patent: Jul. 4, 2000

[54] METHOD FOR PRODUCING A PN-JUNCTION FOR A SEMICONDUCTOR DEVICE OF SIC

[75] Inventor: Per-Åke Nilsson, Bandhagen, Sweden

[73] Assignee: ABB Research Ltd., Zurich, Switzerland

[21] Appl. No.: 09/146,440

[22] Filed: Sep. 3, 1998

[51] Int. Cl.[7] .................................................. H01L 21/265
[52] U.S. Cl. ............................................ 438/519; 438/931
[58] Field of Search .................................... 438/507, 518, 438/519, 734, 735, 737, 738, 931, 970; 257/77

[56] References Cited

U.S. PATENT DOCUMENTS 4,947,218   8/1990   Edmond et al. ......................... 257/77

*Primary Examiner*—Charles Bowers
*Assistant Examiner*—Keith Christianson
*Attorney, Agent, or Firm*—Pollock, Vande Sande & Amernick

[57] ABSTRACT

A method for producing a pn-junction for a semiconductor device of SiC intended to have at least one lateral zone of junction termination with a lower doping concentration of a first conductivity type than a main zone for smearing out the electrical field at said junction comprising at least the step of applying a first layer of SiC over the entire surface and on top of a second layer of SiC. A mask is applied on the first layer over a portion thereof where said main zone and an ohmic contact are to be formed. It is after that etched through the first layer to the second layer while leaving a main zone of said first layer and a contact layer thereof under said mask.

12 Claims, 2 Drawing Sheets

METHOD FOR PRODUCING A PN-JUNCTION FOR A SEMICONDUCTOR DEVICE OF SIC

TECHNICAL FIELD OF THE INVENTION AND PRIOR ART

The present invention relates to a method for producing a pn-junction for a semiconductor device of SiC intended to have at least one lateral zone of junction termination with a lower doping concentration of a first conductivity type than a main zone to even out the electrical field at said junction, said method comprising at least the steps of:

a) applying a first layer of SiC of said first conductivity type, p or n, on top of a second layer of a second conductivity type, opposite to the first type, said first layer either 1) having a first sub-layer closest to said second layer able to form a pn-junction with an acceptably high breakdown voltage and a second sub-layer on top thereof able to form an ohmic contact for the device, or 2) being one layer able to both form a pn-junction with an acceptably high break-down voltage and an ohmic contact for the device, wherein in case of 1) the sub-layers are applied in different steps, b) applying a mask on said first layer over a portion thereof where said main zone and said ohmic contact are to be formed, and c) etching through the first layer to the second layer while leaving a said main zone of said first layer and a contact layer thereof under said mask for exposing said second layer laterally thereto for later implantation of dopants of said first type into a surface layer of the second layer for forming at least one said lateral junction termination zone therein.

The production of such pn-junctions of all types of semiconductor devices, in which there is a need of such pn-junction and one or more zones to even out the electrical field at said junction in the blocking state thereof, are comprised, but further below the specific case of the production of an anode of a pindiode will be discussed for illuminating the invention and the problem it has to solve but not for restricting the scope of the invention in any way.

The physical properties of SiC making this material well suited for use in semiconductor devices as well as the difficulties encountered in the production of such semiconductor devices are well known. The use of SiC is particularly advantageous where it is possible to benefit from the superior properties of SiC in comparison with especially Si, namely the capability of SiC to function well under extreme conditions. SiC has a high thermal stability due to a large bandgap energy, such that devices fabricated from said material are able to operate at high temperatures, namely up to 1000 K. Furthermore, it has a high thermal conductivity, so that SiC devices can dissipate a high power without overheating. SiC also has a more than five times higher breakdown field than Si, so that it is well suited as a material in high power devices operating under conditions where high voltages may occur in the blocking state of a device.

However, some of the techniques used to produce semiconductor devices of other materials, such as Si, may not be used or only used under altered conditions for SiC. Most dopants do not really diffuse at all in SiC, and a few diffuse very slowly in SiC when the SiC is heated to extremely high temperatures, such as in the order of 2000° C. Accordingly, the diffusion technique is not suited as a processing technique for SiC. The techniques of implanting dopants into a SiC-layer and the technique of epitaxial growth of a SiC-layer together with dopants have therefore remained as the main techniques available for producing doped layers of SiC. However, a SiC-layer subjected to implantation has to be kept at a temperature in the range of e.g. 500–1000° C. during the implantation step putting severe stresses on the material used for a mask for the implantation. Furthermore, the implanted layer has to be annealed so as to activate the dopants implanted at a comparatively high temperature, primarily above 1500° C. Another problem is that it is difficult to etch away a layer of SiC on another SiC-layer and stop the etching when reaching the SiC-layer, since the etching process may not by itself stop when it reaches the SiC-layer.

The main problem of the methods already known of the type defined in the introduction is that too many mask layers have to be used in the method, and the time needed for carrying out such a method is almost directly proportional to the number of mask layers, so that such a device will be comparatively costly. In such a method already known a mask is applied on top of the first layer and patterned for implanting ions in the second low doped n-type layer for forming the pn-junction, and this implantation is carried out at a temperature in the range of e.g. 500–1000° C. The metal of the implantation mask used can cluster at this temperature and sometimes holes are formed in the metal. This can sometimes completely destroy the mask during implantation and thus the anode will be implanted in the wrong place. Furthermore, due to the high temperature during implantation it is very difficult to achieve a clean surface after the mask has been removed. A further mask has then to be applied after an epitaxial growth of a contact layer able to form an ohmic contact of the device, so that it may be etched down to the first layer for the later formation of junction termination zones while leaving the anode layer in place under the mask.

SUMMARY OF THE INVENTION

The object of the present invention is to provide a method of the type defined in the introduction which reduces the inconveniences mentioned above of the method according to the prior art to a large extent.

This object is according to the invention obtained by designing such a method so that the entire first layer is in step a) formed by applying it over the entire surface of the second layer without any presence of any mask layer.

By applying the first layer in step a) over the entire surface of the second layer the number of mask layers is reduced to one and the number of processing steps will by that also be considerably reduced, so that this part of the semiconductor device may be manufactured in a considerably shorter period of time than before and accordingly to a much lower cost. Furthermore, since a mask is only present during the etching step, it will not be critical at all to use the implantation technique for forming a part of or the entire first layer.

According to a preferred embodiment of the invention said first layer has said two sub-layers, and the first sub-layer is formed by implanting ions into the second layer over the entire surface thereof, and the second sub-layer is formed by subsequently epitaxially growing it by Chemical Vapor Deposition (CVD) on top of the entire first sub-layer so formed. By forming the first sub-layer in this way by implanting ions into the second layer over the entire surface thereof and later on in step c) etching away the first layer except for a region under the mask no mask has to be used during the implantation, so that the problems associated with using an implantation mask at high temperatures are solved.

According to another preferred embodiment of the invention said etching in step c) is carried out at an angle to a perpendicular to the surface of the second layer for forming an edge of said first layer sloping to the second layer so that the first layer is broadened in the direction to the second layer. This is very advantageous, since this solves a severe problem of the methods already known of this type. As stated above, it is not possible to stop the etching process at a certain plane, such as the plane of the interface of the first and second layers, in SiC, which in combination with the fact that the thickness of the layer of SiC epitaxially grown varies for different wafers of SiC makes it necessary to measure the thickness of the layer epitaxially grown for each wafer for determining the etch depth individually for each wafer, which of course constitutes a costly procedure. The etch depth is very critical, since if too little material is etched away there will be a short-circuiting of the device through the part of the first layer remaining over the second layer. If on the other too much material is etched away, after the subsequent implantation into the second layer for forming the junction termination zones it will not be possible to obtain any contact between these zones and the main zone of the pn-junction, so that the device will not be able to hold a voltage being high enough when reverse biased. Due to the inclined etching according to this embodiment of the present invention the etch depth is not critical any longer, but it may be etched so deep that the second layer is reached with certainty. Any later implantation for forming a junction termination zone will then result in an implantation through the lower boarder of the first layer left, so that a part of such a junction termination zone will be located under this boarder and well in contact with the first layer. Accordingly, it is not necessary to measure the thickness of the first layer for each wafer and determine the etch depth individually for each wafer any longer.

According to a preferred embodiment of the invention constituting a further development of the embodiment last mentioned said angle is between 30 and 60°, preferably approximately 45°. It has been found that such an angle will ensure a good contact of a junction termination zone to the first layer formed later through implantation substantially in parallel with said perpendicular.

According to another preferred embodiment of the invention an additional mask is in step b) also applied at a distance laterally to said main zone for forming an orientation mark for different steps of manufacturing the semiconductor device, and in said etching step c) an orientation mark is thereby left under this additional mask. Such an orientation mark was in the methods already known formed by the application and removal of a separate mask before the implantation of the first layer into the second layer, so that the application of this additional mask at the same time as the mask for the etching will in fact mean that the number of mask layers for obtaining the pn-junction of this type and the orientation mark will be reduced from 3 to 1, which reduces the number of process steps and the cost for producing the device even more.

According to another preferred embodiment of the invention the first conductivity type is p and the second conductivity type is n. It is most suited to apply a first layer of p-type in this way, but it is emphasized that the invention is not in any way restricted thereto.

According to another preferred embodiment of the invention aluminium and boron are implanted into the lower doped n-type second layer of SiC for forming said first layer. This is advantageous, since boron has a higher diffusivity in SiC than aluminium and will during the subsequent annealing step penetrate further into the n-type layer than aluminium and forming a pn-junction being able to withstand higher voltages when reverse biased than a pn-junction formed by the implantation of only aluminium, whereas the sub-layer on top thereof of aluminium will result in a lower on-state voltage of the device and the possibility of forming a better ohmic contact to an ohmic contact metallization than would only boron have been implanted.

According to another preferred embodiment of the invention the method is carried out for producing the anode side of a diode, and in particular it is used for producing the anode side of a pin-diode. The method according to the invention is very well suited for exactly this purpose and the advantages with respect to the methods already known discussed above are very helpful for this application of the method.

The invention also relates to a semiconductor device of SiC. The advantages thereof and of the preferred embodiments thereof appear from the above discussion of the different embodiments of the method according to the invention.

Further advantages as well as advantageous features of the invention appear from the following description and the other dependent claims.

BRIEF DESCRIPTION OF THE DRAWINGS

With reference to the appended drawings, below follows a specific description of preferred embodiments of the invention cited as examples.

DETAILED DESCRIPTION OF PREFERRED EMBODIMENTS OF THE INVENTION

Figure 1:
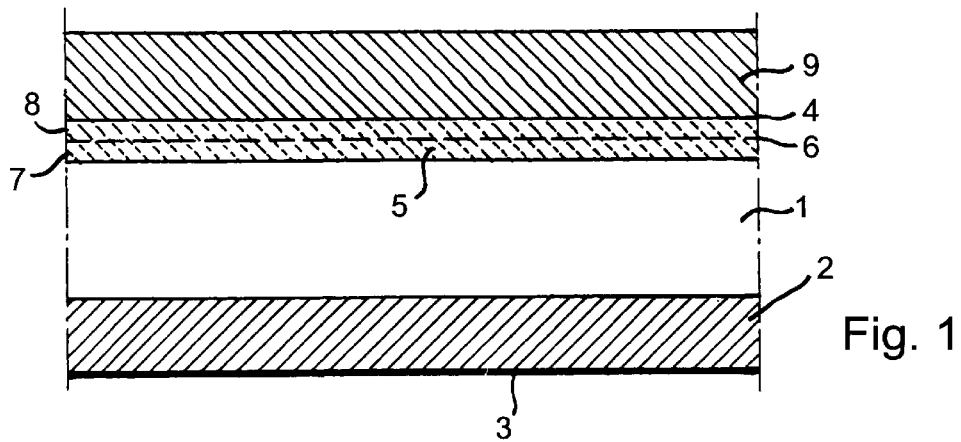
FIGS. 1–4 Illustrate schematically different steps of a method for producing the anode side of a pin-diode of SiC according to a first preferred embodiment of the invention, and FIG. 5 Illustrated schematically a device produced by carrying out a method according to a second preferred embodiment of the invention.

FIGS. 1–4 illustrate a few important steps of a larger number of steps in a method for producing the anode side of a power pin-diode of SiC. It should also be noticed that the present invention is only occupied with a method for producing a pn-junction for a semiconductor device of SiC and not to a method for producing the entire device, and a method of the type last mentioned comprises of course many more process steps, which will not be dealt with here.

An intrinsic or low doped n-type drift layer is epitaxially grown on top of a highly doped n-type substrate layer 2, on the back-side of which a contact layer 3 with an ohmic contact and a bond metallization is applied. The doping concentrations of the layers 1 and 2 are preferably in the ranges $10^{14}$–$10^{16}$ cm$^{-3}$ and $10^{19}$–$5\times10^{20}$ cm$^{-3}$, respectively, and the donors used are preferably N or P.

The drift layer 1 extends to the line 4 before the method according to the invention is started. The method according to the invention is started by implanting ions of boron and aluminium into a surface near layer 5 of the drift layer 1 over the entire surface of the drift layer by bombardment after accelerating them by a voltage in the range of 50–300 kV. The implantation is carried out while heating the entire wafer at a temperature in the range of e.g. 500–1000° C. After the implantation the layer 5 is annealed by heating it to 1500° C. for making the ions implanted electrically active. By implanting ions of boron and aluminium the boron ions will penetrate deeper into the layer 1 than the aluminium, which is indicated by the dashed line 6 dividing the first sub-layer 5 into a lower part 7 with boron implants and an upper part 8 with aluminium implants. The thickness of the first sub-layer 5 produced in this way is about 0.2–0.3 µm, which may be compared to the thickness of the drift layer 1, which may be approximately 30 µm.

A second sub-layer 9 of p-type and highly doped with aluminium is after that epitaxially grown by Chemical Vapor Deposition (CVD) on top of the first sub-layer 5 over the entire surface thereof. The thickness of this second sub-layer is preferably in the range of 0.3–1.0 µm. Such a second sub-layer epitaxially grown is able to form an ohmic contact for the anode of the diode produced in this way.

Figure 2:
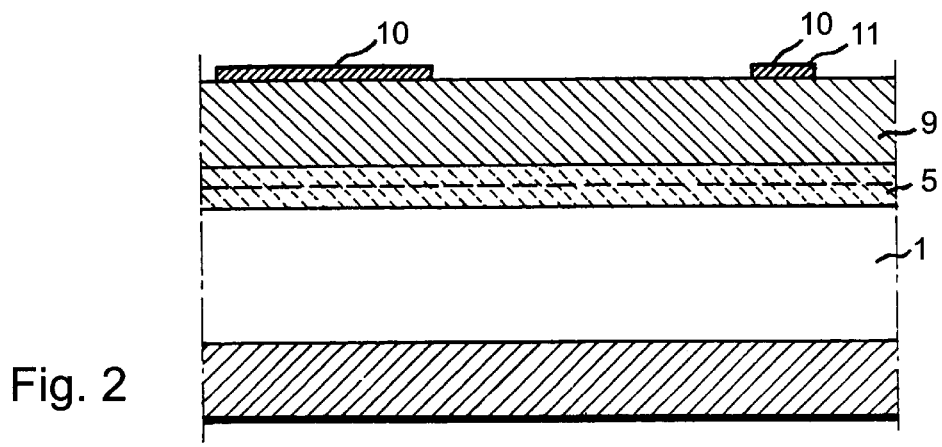

Referring to FIG. 2, in which it is shown how a mask 10 is applied on top of the layer 9 and patterned so that it remains over a portion of the layer 9 where a main zone of the pn-junction of the device and the contact to the anode thereof is to be formed and an additional mask part 11 is left where an orientation mark for different steps of the manufacturing of the semiconductor device is left.

Figure 3:
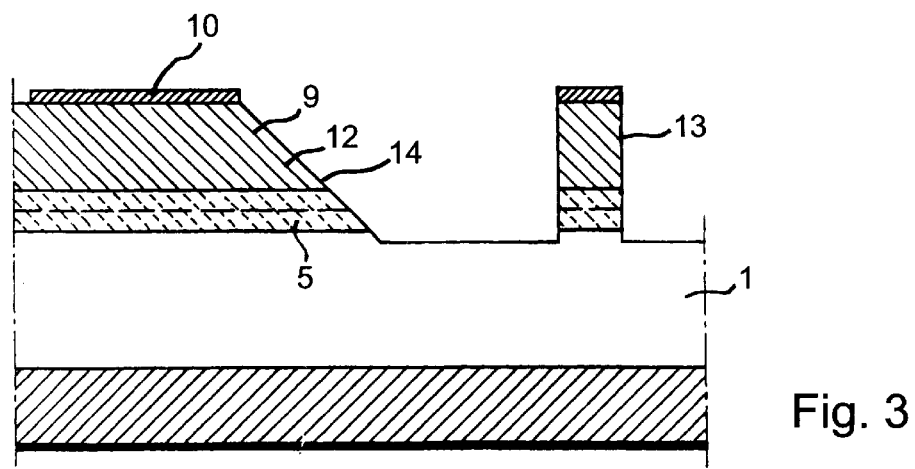
Figure 4:
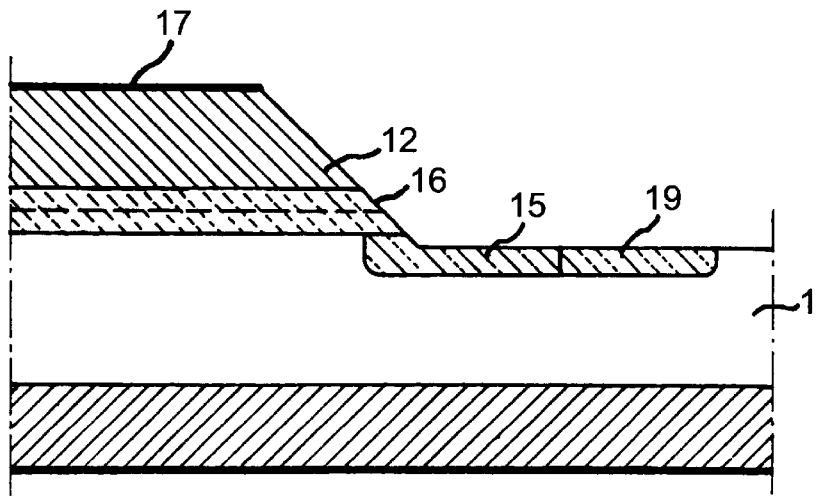

Referring to FIG. 3, it is shown that an etching step is applied to the structure shown in FIG. 2 in the way that an etching is carried out through the sub-layers 9 and 5 and down into the layer 1 while leaving a main zone 12 of the first layers 5, 9 under the mask 10 for exposing the layer 1 laterally thereto for later implantation of dopants (shown in FIG. 4) of p-type into a surface layer of the layer 1 for forming at least one lateral junction termination zone therein. An orientation mark 13 is also formed by said etching. The etching is carried out at an angle of approximately 45° to a perpendicular to the surface of the layer 1 for forming an edge 14 of the layers 5, 9 sloping to the layer 1 so that the layer 5, 9 is broadened in the direction to the layer 1. The method according to the invention is in fact to be considered to stop here, but it is illustrated in FIG. 4 how further steps of the process for manufacturing the device may be carried out, since the method according to the invention provides a possibility of carrying out these steps in a very advantageous way. Due to the fact that the etching is made in an inclined way it is not critical to stop the etching exactly when reaching the interface between the sub-layer 5 and the n-type drift layer 1, but it may be etched into the drift layer 1, since an implantation of dopants into the layer 1 close to the sub-layer 5 for forming a first zone 15 for junction termination with a lower doping concentration than the layers 5 and 9 will result in an implanting through the-lower border 16 of at least the layer 5. Accordingly, a good contact will be established between the layer 5 and the junction termination zone 15 thus formed. It is shown in FIG. 4 how the device may have a further junction termination zone 19 with a lower doping concentration than the zone 15, and the device may be provided with even more zones according to this principle. It is also illustrated how the mask 10 has been removed and a contact layer 17 for the anode contact has been applied, and this contact layer may consist of an ohmic contact metallization and a bond metallization. The device also comprises other type of layers, such as a channel stopper, passivation layers and the like.

Figure 5:
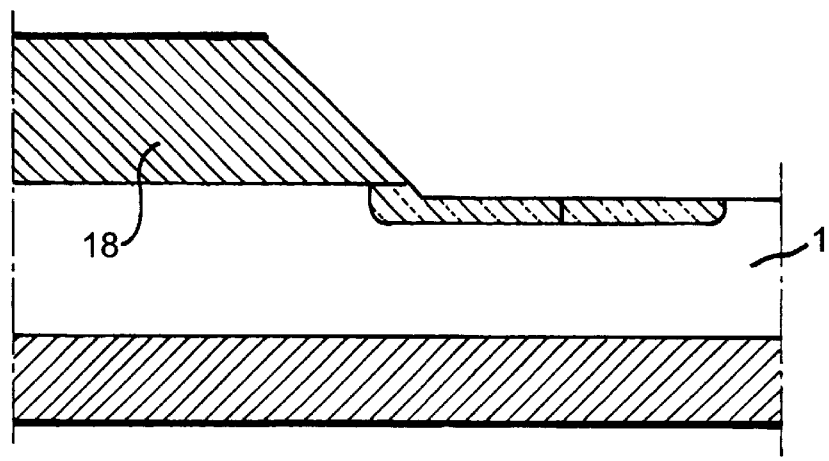

A method according to a modified embodiment of the invention is briefly illustrated in FIG. 5, and this differs from the method illustrated in FIG. 1–4 by the fact that the steps of implantation and epitaxial growth for producing the p-type layer for the pn-junction and for forming an ohmic contact are here replaced by a single step of either implantation over the entire surface of the layer 1 or epitaxial growth over the entire surface of the layer 1. It is within the scope of the present invention to proceed in this way, but it is emphasized that it is much easier to form a pn-junction having an acceptably high breakdown voltage by implantation and a good ohmic contact by epitaxial growth than conversely, The invention is of course not in any way restricted to the embodiments described above, but several possibilities to modifications thereof would be apparent to a man skilled in the art without departing from the basic idea of the invention.

All the definitions concerning the material of the different layers of course also include inevitable impurities as well as intentional doping when SiC is concerned. Other angles for the etching than the one illustrated in the figures are of course conceivable, and it is also within the scope of the present invention to etch at a zero angle with respect to said perpendicular should it be possible to instead later on implant ions for the junction termination zone obliquely to the normal implantation direction for still obtaining a contact between a junction termination zone and the first layer.

It is also possible to change the conductivity types of the layers and accordingly form a first layer of n-type on top of a low doped layer of the p-type, although this would hardly be preferred among others because the spontaneous n-type doping of SiC.

What is claimed is:

1. A method for producing a pn-junction for a semiconductor device of SiC intended to have at least one lateral zone of junction termination with a lower doping concentration of a first conductivity type than a main zone for smearing out the electrical field at said junction, said method comprising at least the steps of:

a) applying a first layer of SiC of said first conductivity type, p or n, on top of a second layer of a second conductivity type, opposite to the first type, said first layer either 1) having a first sub-layer closest to said second layer able to form a pn-junction with an acceptably high breakdown voltage and a second sub-layer on top thereof able to form an ohmic contact for the device, or 2) being one layer able to both form a pn-junction with an acceptably high breakdown voltage and an ohmic contact for the device, wherein in case of 1) the sub-layers are applied in different steps, b) applying a mask on said first layer over a portion thereof where said main zone and said ohmic contact are to be formed, and c) etching through the first layer to the second layer while leaving a said main zone of said first layer and a contact layer thereof under said mask for exposing said second layer laterally thereto for later implantation of dopants of said first type into a surface layer of the second layer for forming at least one said lateral junction termination zone therein, wherein the entire first layer is in step a) formed by applying it over the entire surface of the second layer without any presence of any mask layer.

2. A method according to claim 1, wherein epitaxial growth by Chemical Vapor Deposition (CVD) is used for applying said first layer.

3. A method according to claim 1, wherein the technique of implantation of ions of said first conductivity type into the second layer over the entire surface thereof is used for applying said first layer.

4. A method according to claim 1, wherein said first layer has said two sub-layers, and the first sub-layer is formed by implanting ions into the second layer over the entire surface thereof, and the second sub-layer is formed by subsequently epitaxially growing it by Chemical Vapor Deposition (CVD) on top of the entire first sub-layer so formed.

5. A method according to claim 3, wherein said second layer is heated to a temperature exceeding 700° C. during said implantation.

6. A method according to claim 1, wherein said etching in step c) is carried out at an angle to a perpendicular to the surface of the second layer for forming an edge of said first layer sloping to the second layer so that the first layer is broadened in the direction to the second layer.

7. A method according to claim 6, wherein said angle is between 30 and 60°, preferably approximately 45°.

8. A method according to claim 1, wherein an additional mask is in step b) also applied at a distance laterally to said main zone for forming an orientation mark for different steps of manufacturing the semiconductor device, and that thereby in said etching step c) an orientation mark is left under this additional mask.

9. A method according to claim 1, wherein the first conductivity type is p and the second conductivity type is n.

10. A method according to claim 9, wherein aluminium and boron are implanted into a lower doped n-type second layer of SiC for forming said first layer.

11. A method according to claim 9, wherein it is carried out for producing the anode side of a diode.

12. A method according to claim 11, wherein it is used for producing the anode side of a pin-diode.

* * * * *